(12) United States Patent
Yamamoto

(10) Patent No.: US 9,184,146 B2
(45) Date of Patent: Nov. 10, 2015

(54) SEMICONDUCTOR PACKAGE AND WIRING BOARD HAVING THE SEMICONDUCTOR PACKAGE THEREON

(71) Applicant: DENSO CORPORATION, Kariya, Aichi-pref. (JP)

(72) Inventor: Toshihisa Yamamoto, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/521,609

(22) Filed: Oct. 23, 2014

(65) Prior Publication Data

US 2015/0115430 A1    Apr. 30, 2015

(30) Foreign Application Priority Data

Oct. 29, 2013 (JP) ................................. 2013-224076

(51) Int. Cl.

| | |
|---|---|
| H05K 1/11 | (2006.01) |
| H01L 23/00 | (2006.01) |
| H01L 23/04 | (2006.01) |
| H05K 1/18 | (2006.01) |
| H01L 23/498 | (2006.01) |
| H01L 25/065 | (2006.01) |

(52) U.S. Cl.
CPC ............... *H01L 24/14* (2013.01); *H01L 23/04* (2013.01); *H01L 23/498* (2013.01); *H01L 25/065* (2013.01); *H05K 1/113* (2013.01); *H05K 1/181* (2013.01); *H01L 2224/13014* (2013.01); *H01L 2224/14131* (2013.01); *H01L 2224/16227* (2013.01); *H01L 2924/13091* (2013.01); *H01L 2924/15311* (2013.01); *H01L 2924/15321* (2013.01); *H01L 2924/15331* (2013.01); *H05K 2201/10734* (2013.01)

(58) Field of Classification Search
CPC ................. H01L 2924/01082; H01L 2924/14; H01L 2224/73204; H01L 24/12; H01L 2224/05572; H01L 2224/73203; H01L 23/3128; H01L 23/49816
See application file for complete search history.

(56) References Cited

U.S. PATENT DOCUMENTS

| | | | | |
|---|---|---|---|---|
| 5,886,409 | A | * | 3/1999 | Ishino et al. .................. 257/737 |
| 6,153,448 | A | * | 11/2000 | Takahashi et al. ............ 438/114 |
| 8,482,121 | B2 | * | 7/2013 | Ito ................................. 257/736 |
| 2003/0114024 | A1 | | 6/2003 | Miyagawa |

FOREIGN PATENT DOCUMENTS

| | | |
|---|---|---|
| JP | 2003-273286 | 9/2003 |
| JP | 2006-073844 | 3/2006 |
| JP | 2013-045997 | 3/2013 |
| JP | 2013-062324 A | 4/2013 |

OTHER PUBLICATIONS

Aug. 27, 2015 Office Action issued in Japanese Application No. 2013-224076 (with translation).

* cited by examiner

*Primary Examiner* — Roy Potter
(74) *Attorney, Agent, or Firm* — Nixon & Vanderhye P.C.

(57) ABSTRACT

A semiconductor package includes a chip, a sealing body covering the chip, and a plurality of external connection terminals connected to the chip. The external connection terminals expose from a surface of the sealing body and are arranged in a grid on the surface of the sealing body. In the grid on the surface of the sealing body, each external connection terminal is adjacent to an area vacant of an other external connection terminal in at least one direction of eight directions from each external connection terminal, the eight directions including first linear directions along a row of the grid, second linear directions along a row of the grid perpendicular to the first linear directions, and four diagonal directions defined between the first linear directions and the second linear directions.

11 Claims, 13 Drawing Sheets

SEMICONDUCTOR PACKAGE AND WIRING BOARD HAVING THE SEMICONDUCTOR PACKAGE THEREON

CROSS REFERENCE TO RELATED APPLICATION

This application is based on Japanese Patent Application No. 2013-224076 filed on Oct. 29, 2013, the disclosure of which is incorporated herein by reference.

TECHNICAL FIELD

The present disclosure relates to a semiconductor package and a wiring board having the semiconductor package thereon, more particularly, relates to an arrangement of external connection terminals of the semiconductor package and an arrangement of pads of the wiring board.

BACKGROUND

A semiconductor package having a plurality of external connection terminals and a wiring board having the semiconductor package thereon have been conventionally known. For example, JP 2003-188508 A, which corresponds to US 2003/0114024 A1, discloses a wiring board having a ball grid array (BGA) type semiconductor package thereon. The BGA type semiconductor package has a plurality of external connection terminals arranged in a grid.

In the semiconductor package of JP 2003-188508 A, among the external connection terminals arranged in the grid on one surface of a sealed body, each of the external connection terminals other than the external connection terminals located on an outermost square-lap of the grid is adjacent to another external connection terminal in a predetermined area in any of eight directions from each external connection terminal, the eight directions including horizontal directions along a horizontal row of the grid, vertical directions perpendicular to the horizontal directions, and four diagonal directions between the horizontal directions and the vertical directions.

In the wiring board of JP 2003-188508 A, a substrate is provided with a plurality of pads that are arranged in a grid to correspond to the external connection terminals of the semiconductor package. Among the plurality of pads, each of the pads other than the pads located on an outermost square-lap of the grid is adjacent to another pad in a predetermined area in any of eight directions from each pad, the eight directions including horizontal directions along a horizontal row of the grid, vertical directions perpendicular to the horizontal directions, and four diagonal directions between the horizontal directions and the vertical directions.

Further, wirings are extended from the pads other than the pads located on the outermost square-lap of the grid to an external area outside of a semiconductor package arrangement area while passing through in between other pads. Moreover, wirings extended from center pads located at a center area of the semiconductor package arrangement area among the pads are connected to vias that are located in between other pads.

In the wiring board of JP 2003-188508 A, since the plurality of pads is densely arranged in the grid, a minimum value of a clearance between the adjacent pads is equal to less than a predetermined value. Therefore, in a case where a thickness of a surface copper foil on the surface of the wiring board is equal to or greater than a predetermined value and the width of the wirings is large, it is difficult to extend the wiring between the pads without contacting the pads, and to form the vias between the pads without contacting the pads. If the wiring or the via contacts the pad, or if a clearance is not ensured with a predetermined size or more between the wiring and the pad or between the via and the pad, reliability of input and output signals of the semiconductor package, which are conducted through the wiring, is likely to decrease.

SUMMARY

It is an object of the present disclosure to provide a semiconductor package which enables to easily extend a wiring from a pad without contacting another pad when being mounted on a wiring board, and the wiring board having the semiconductor package thereon.

According to an aspect of the present disclosure, a semiconductor package includes a chip, a sealing body and a plurality of external connection terminals. The sealing body covers the chip. The external connection terminals are connected to the chip, and expose from a surface of the sealing body. The external connection terminals are arranged in a grid on the surface of the sealing body. In the grid, each external connection terminal is adjacent to an area vacant of an other external connection terminal within a predetermined area in at least one direction of eight directions from each external connection terminal. The eight directions include first linear directions along a row of the grid, second linear directions along a row of the grid perpendicular to the first linear directions, and four diagonal directions defined between the first linear directions and the second linear directions.

When the semiconductor package according to the first aspect is mounted on a substrate of a wiring board having a plurality of pads, a surface wiring can be easily extended from any pad without contacting the other pads. As such, reliability of signals that are outputted from or inputted to the semiconductor package through the surface wiring improves.

According to a second aspect of the present disclosure, a wiring board includes a substrate, a plurality of pads, and a surface wiring. The substrate has a first surface for receiving thereon a semiconductor package that has a plurality of external connection terminals arranged in a grid. The pads are disposed on the first surface of the substrate to correspond to the external connection terminals of the semiconductor package to be electrically connected to the external connection terminals. The surface wiring is disposed on the first surface of the substrate. The surface wiring has a first end electrically connected to one of the pads. The surface wiring has a width greater than a predetermined value. The pads are arranged such that each pad is adjacent to a specific area vacant of an other pad within a predetermined area in at least one direction of eight directions from each pad. The eight directions include first linear directions along a row of the grid, second linear directions along a row of the grid perpendicular to the first linear directions, and four diagonal directions defined between the first linear directions and the second linear directions.

In the wiring board according to the second aspect, the pads on the surface of the substrate are arranged such that each pad is adjacent to the specific area vacant of the other pad within a predetermined area at least in one direction of the eight directions. In a case where the semiconductor package is mounted on the wiring board, the surface wiring can be disposed in or in the vicinity of the specific area. As such, the surface wiring can be easily extended from any pad without contacting the other pads. Accordingly, reliability of signals that are outputted from or inputted to the semiconductor package through the surface wiring improves.

BRIEF DESCRIPTION OF THE DRAWINGS

The above and other objects, features and advantages of the present disclosure will become more apparent from the following detailed description made with reference to the accompanying drawings, in which like parts are designated by like reference characters and in which.

DETAILED DESCRIPTION

Figure 1:
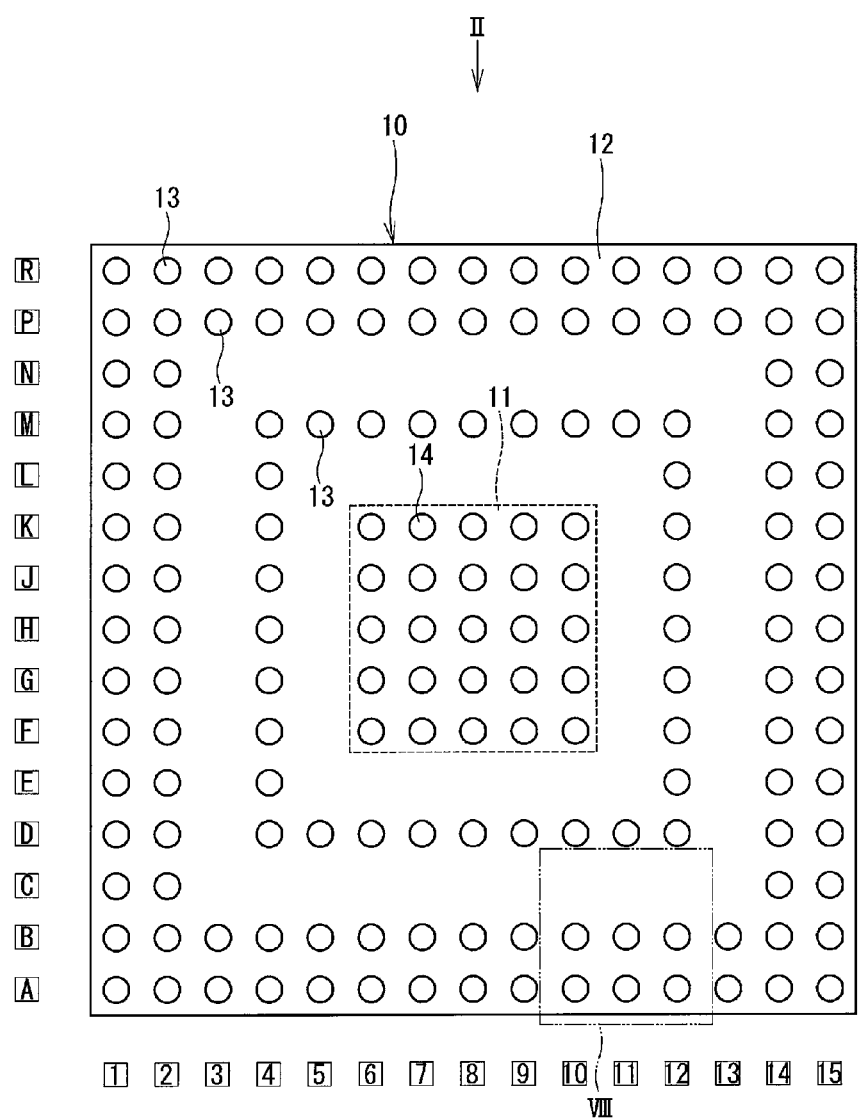
FIG. 1 is a plan view of a semiconductor package to be mounted on a wiring board according to a first embodiment of the present disclosure.

Hereinafter, embodiments of a semiconductor package and a wiring board having the semiconductor package thereon will be described with reference to the drawings.

In the embodiments, like parts are designated with like reference characters, and descriptions thereof will not be repeated. For the sake of clarity of the drawings, among the plural same parts, only one or some of the parts are designated with the reference characters.

First Embodiment

A semiconductor package and a wiring board according to a first embodiment are illustrated in FIGS. 1 to 5. The semiconductor package is mounted on the wiring board. In the first embodiment, the wiring board having the semiconductor package thereon is exemplarily employed to a rotary electric machine, as shown in FIG. 6.

A rotary electric machine 2 is driven as being supplied with electric power. For example, the rotary electric machine 2 is employed to an electric power steering apparatus for assisting a steering operation in a vehicle.

Figure 7:
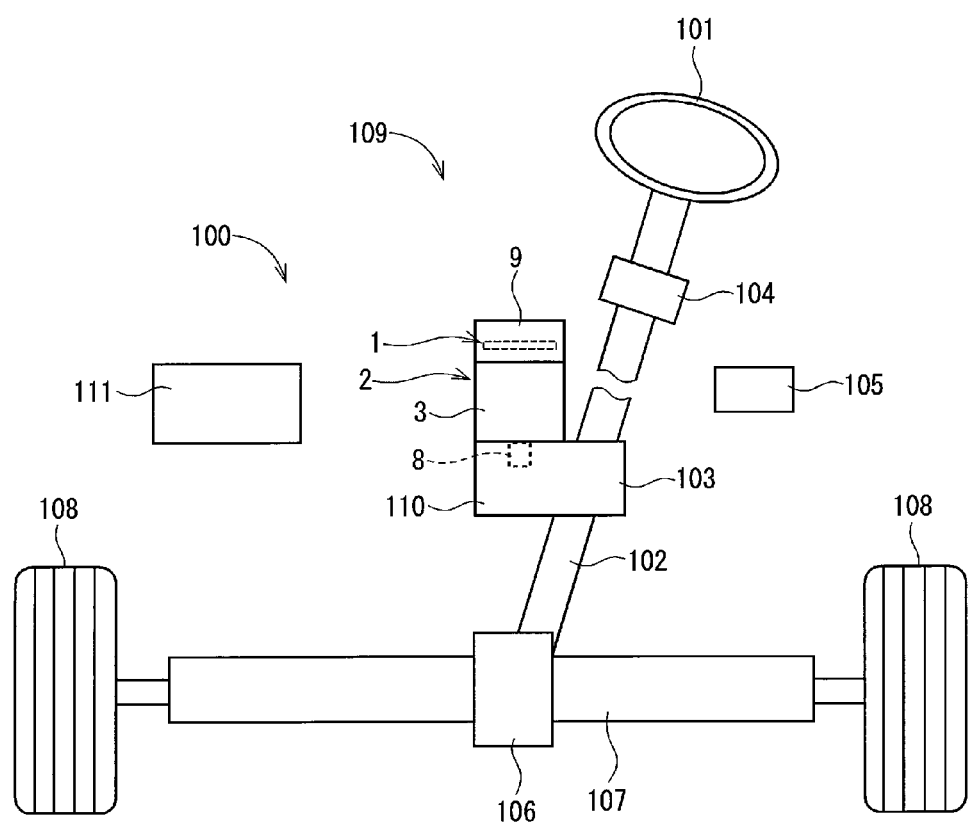
FIG. 7 is a schematic diagram illustrating an example where the rotary electric machine having the wiring board according to the first embodiment is employed to an electric power steering apparatus.

FIG. 7 illustrates an overall structure of a steering system 100 having an electric power steering apparatus 109. In the electric power steering apparatus 109, a torque sensor 104 is equipped to a steering shaft 102 connected to a steering wheel 101. The torque sensor 104 detects a steering torque that is provided to the steering shaft 102 from a driver through the steering wheel 101.

A pinion gear 106 is provided at an end of the steering shaft 102. The pinion gear 106 is engaged with a rack shaft 107. A pair of wheels 108 is coupled to the ends of the rack shaft 107 through tie rods or the like to be rotatable.

When the driver rotates the steering wheel 101, the steering shaft 102 connected to the steering wheel 101 rotates. The rotation of the steering shaft 102 is transferred into a linear motion of the rack shaft 107 by the pinion gear 106. Thus, the pair of wheels 108 is operated by an angle according to the displacement of the linear motion of the rack shaft 107.

The electric power steering apparatus 109 includes the rotary electric machine 2 that generates a steering assist torque, a speed reduction gear 103 that reduces the speed of rotation of the rotary electric machine 2 and transfers the rotation to the steering shaft 102, and the like. In the present embodiment, the rotary electric machine 2 is fixed to a housing 110 of the speed reduction gear 103.

The rotary electric machine 2 is, for example, a three-phase drive type brushless motor. The rotary electric machine 2 is driven by electric power supplied from a battery 111. The rotary electric machine 2 reciprocally rotates the speed reduction gear 103 as a device to be driven. The electric power steering apparatus 109 includes the above-described torque sensor 104, and a vehicle speed sensor 105 that detects a speed of the vehicle.

In the electric power steering apparatus 109 with the structure described above, based on signals from the torque sensor 104, the vehicle speed sensor 105, and the like, the steering assist torque for assisting the steering operation of the steering wheel 101 is generated from the rotary electric machine 2, and is transmitted to the steering shaft 102 through the speed reduction gear 103. As described above, the electric power steering apparatus 109 is a column assisting type electric power steering apparatus.

As shown in FIG. 6, the rotary electric machine 2 includes a motor case 3, a stator 4, a winding 5, a rotor 6, a shaft 7, an output end 8 and a cover 9.

The motor case 3 is, for example, made of a metal. The motor case 3, for example, has a tubular shape with a bottomed end. The stator 4 is made of a metal such as an iron. The stator 4, for example, has a substantially tubular shape. The stator 4 is disposed inside of the motor case 3 to be coaxial with the motor case 3. The stator 4 is not rotatable relative to the motor case 3.

The winding 5 is made of a metal such as copper. The winding 5 is wound around the stator 4. The rotor 6 is made of a metal, such as iron. The rotor 6, for example, has a substantially cylindrical shape. Magnets (not shown) are arranged on an outer wall of the rotor 6. The rotor 6 is disposed inside of the stator 4 to be coaxial with the stator 4.

The shaft 7 is, for example, made of a metal. The shaft 7 has a rod shape. The shaft 7 is integrated with the rotor 6 at the center of the rotor 6. The shaft 7 is supported by the motor case 3 to be rotatable. The rotor 6 is rotatable with the shaft 7 inside of the stator 4.

The output end 8 is, for example, made of a metal. The output end 8 is disposed at an end of the shaft 7 to expose from the motor case 3 and is rotatable with the shaft 7. The output end 8 is coupled to the speed reduction gear 103 to be engaged with an input portion of the speed reduction gear 103. The output end 8 outputs the rotation of the rotor 6 and the shaft 7 to the speed reduction gear 103 (see FIG. 7). The cover 9 is, for example, made of a metal. The cover 9, for example, has a tubular shape with a bottomed end. The cover 9 is disposed to cover the end of the motor case 3 opposite to the output end 8.

By the structures described above, when the winding 5 is supplied with electric power, a rotating magnetic field occurs in the stator 4, and the rotor 6 rotates. With this, the rotation of the rotary electric machine 2 is outputted from the output end 8 as the steering assist torque, and is transmitted to the steering shaft 102 through the speed reduction gear 103.

In the present embodiment, a wiring board 1 is disposed inside of the cover 9. Namely, the wiring board 1 is integrated into the rotary electric machine 2 and is located axially outside of the stator 4. The wiring board 1 includes a semiconductor package 10, a power module 20 and the like, which will be described later. The wiring board 1 controls the electric power supplied from the battery 111 to the winding 5 to control the drive of the rotary electric machine 2. That is, the wiring board 1 is a control board that controls the rotary electric machine 2 as an object to be controlled.

In the present embodiment, as described above, the rotary electric machine 2 is a mechanical and electrical integrated rotary machine integrally having a motor part and a control part for controlling the motor part. The stator 4, the winding 5 and the rotor 6 are included in the motor part. The wiring board 1 is included in the control part.

Figure 4:
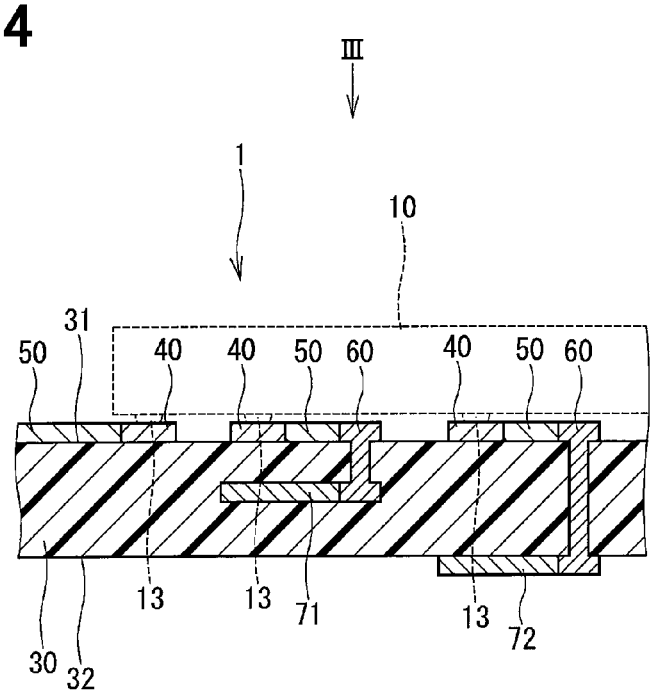
FIG. 4 is a cross-sectional view taken along a line IV-IV in FIG. 3.
Figure 3:
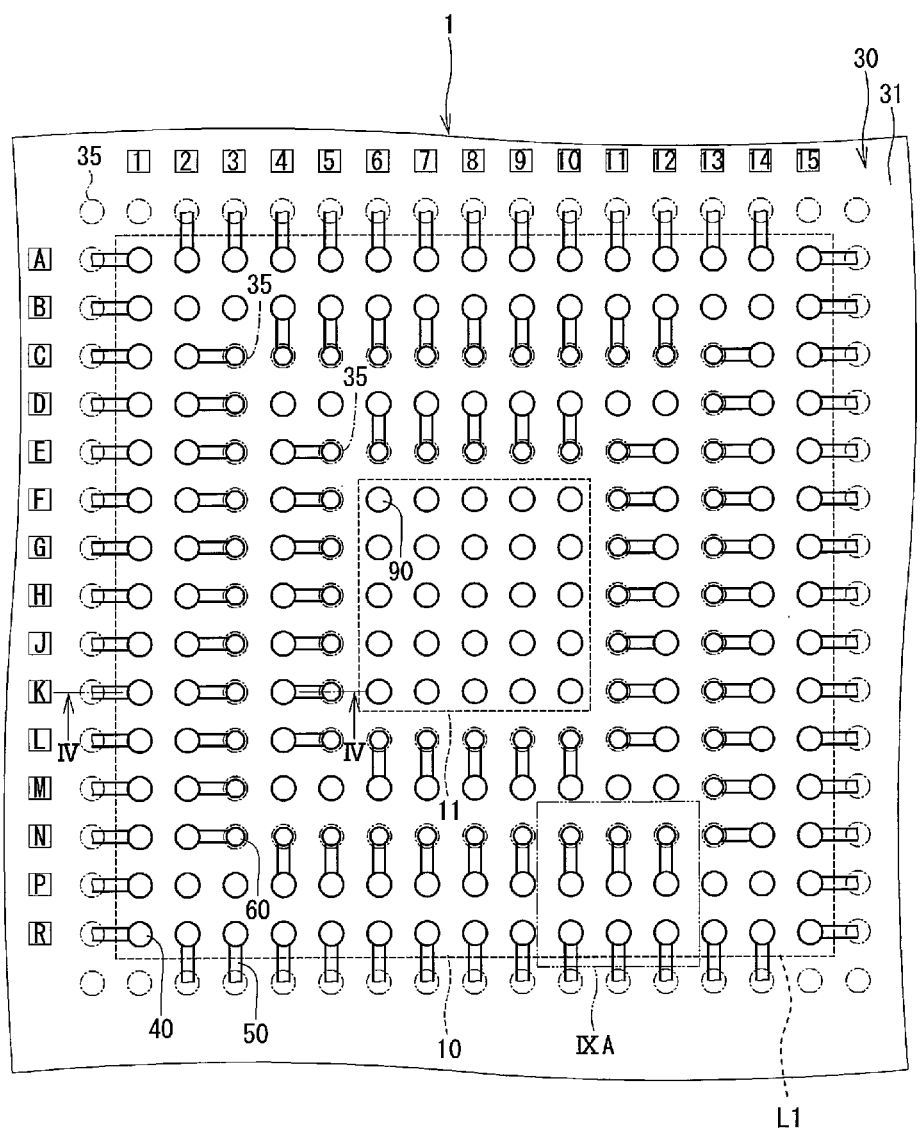
FIG. 3 is a plan view of a part of the wiring board corresponding to an area where the semiconductor package is mounted, according to the first embodiment.
Figure 5:
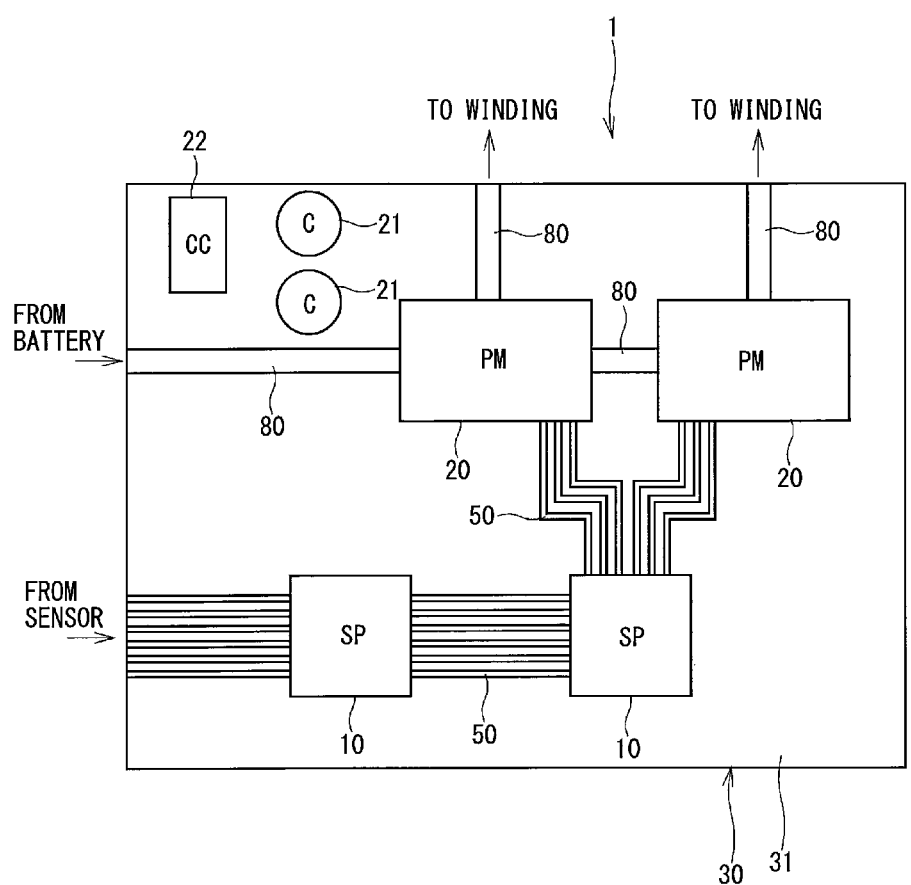
FIG. 5 is a schematic plan view of the wiring board according to the first embodiment.
Figure 6:
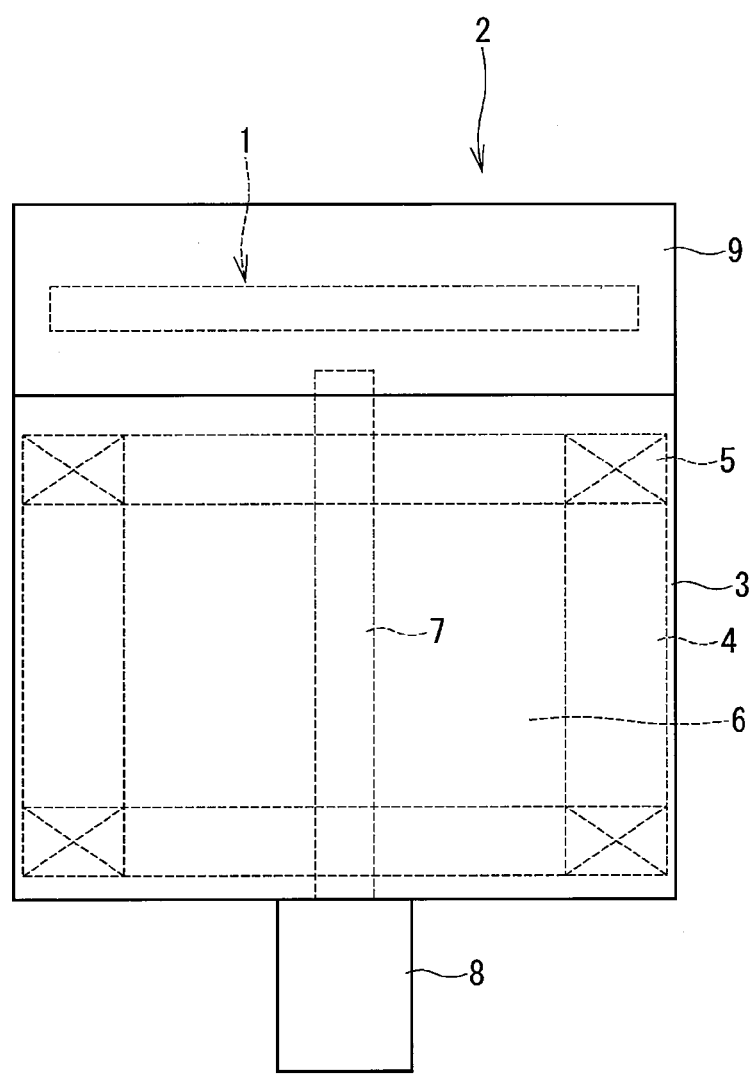
FIG. 6 is a schematic side view of a rotary electric machine having the wiring board according to the first embodiment.

As shown in FIGS. 3, 4 and 5, the wiring board 1 includes a substrate 30, pads 40, surface wirings 50, vias 60, non-surface wirings 71, 72, power wirings 80, semiconductor packages (SP) 10, power modules (PM) 20, capacitors (C) 21, choke coils (CC) 22, and the like.

The substrate 30 is, for example, a printed wiring board, such as FR-4 made of glass fiber and an epoxy resin. As shown in FIG. 5, the semiconductor packages 10, the power modules 20, the capacitors 21, and the choke coils 22 are mounted on a first surface 31 of the substrate 30. That is, these components are surface mount type (SMT) electronic components.

The surface wirings 50 are made of a metal thin film, such as a copper thin film. The surface wirings 50 are disposed on the first surface 31 of the substrate 30. For example, the surface wirings 50 are formed on the first surface 31 of the substrate 30, such as by photolithography, etching or the like.

The power wirings 80 are made of a metal thin film, such as a copper thin film, similar to the surface wirings 50. The power wirings 80 are disposed on the first surface 31 of the substrate 30. For example, the power wirings 80 are formed on the first surface 31 of the substrate 30, such as by photolithography, etching or the like, similar to the surface wirings 50.

Figure 2:
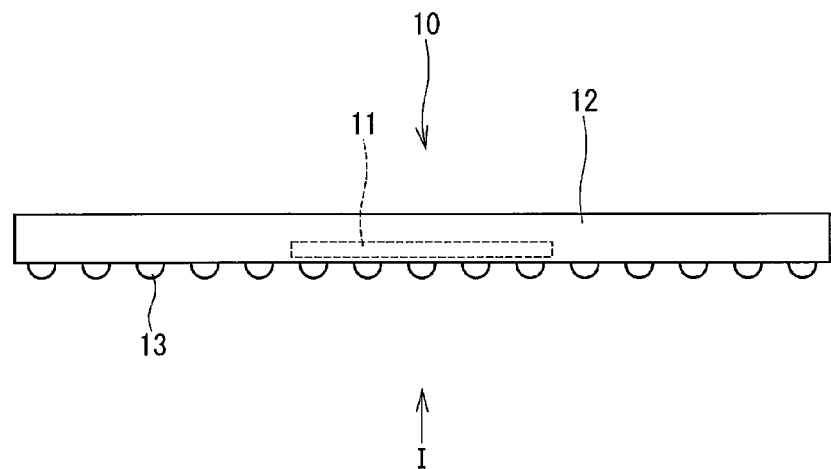
FIG. 2 is a side view of the semiconductor package when viewed along an arrow II in FIG. 1.

As shown in FIGS. 1 and 2, the semiconductor package 10 includes a chip 11, a sealing body 12, and a plurality of external connection terminals 13. The chip 11 includes a CPU as a calculation unit, a ROM and a RAM as storage units, an I/O as an input and output unit, and the like. The sealing body 12 is, for example, made of a resin, and has substantially a rectangular plate shape. The sealing body 12 covers the chip 11. In the present embodiment, the sealing body 12 has a square plate shape.

The external connection terminals 13 are electrically connected to the chip 11. The external connection terminals 13 expose from a surface of the sealing body 12. The semiconductor package 10 allows signals between the chip 11 and external devices through the external connection terminals 13.

In the present embodiment, two semiconductor packages 10 are employed, as shown in FIG. 5. One of the two semiconductor packages 10 serves as a microcomputer, and the other of the two semiconductor packages 10 serves as a custom IC. The two semiconductor packages 10 are connected to each other because the external connection terminals 13 thereof are connected to each other through the surface wirings 50. The semiconductor packages 10 receive signals from sensors, such as the torque sensor 104 and the vehicle speed sensor 105, through the surface wirings 50, as shown in FIG. 5.

The power module 20 has an electric field effect transistor (switching element), such as MOSFET. In the present embodiment, two power modules 20 are employed, as shown in FIG. 5. The two power modules 20 are supplied with the electric power from the battery 111 through the power wirings 80. The power modules 20 are connected to the winding 5 through the power wirings 80.

The semiconductor package 10 and the power modules 20 are connected through the surface wirings 50. The semiconductor package 10 calculates and generates a control signal based on the signals from the sensors, and outputs the control signal to the power modules 20 through the surface wirings 50. Switching operations of the MOSFETs within the power modules 20 are controlled according to the control signal. As a result, the electric power from the battery 111 is converted in the power modules 20, and is supplied to the winding 5 to rotate the rotary electric machine 2. In this way, the semiconductor packages 10 control the switching operations of the power modules 20, thereby to control the rotation of the rotary electric machine 2.

When the rotary electric machine 2 is driven, an electric current having a large value may flow in the power wirings 80. In the present embodiment, therefore, the power wirings 80 have a thickness greater than a predetermined value to reduce a resistance value relative to the width of the wiring, so as to reduce loss. In view of sharing members or components, easing the formation by the photolithography, and the like, in the present embodiment, the surface wirings 50 have the same thickness as that of the power wirings 80.

The capacitor 21 controls a surge voltage that is generated according to the switching (on and off) operation of the power module 20. The choke coil 22 reduces noise of the electric power supplied from the battery 111 to the winding 5 through the power modules 20. In the present embodiment, electronic component, such as a relay and a shunt resistor (not shown) are mounted on the substrate 30, in addition to the capacitor 21, the choke coil 22 and the like.

Next, an arrangement and the like of the external connection terminals 13 of the semiconductor package 10 will be described in detail.

FIG. 1 is a plan view of the semiconductor package 10 when viewed along an arrow I in FIG. 2. As shown in FIG. 1, the external connection terminals 13 are arranged in a grid on a surface of the sealing body 12 of the semiconductor package 10. For example, the external connection terminals 13 are made of a solder, and have a substantially spherical shape. Each of the external connection terminals 13 partly exposes from the surface of the sealing body 12. In other words, the semiconductor package 10 is a ball grid array (BGA) type semiconductor package. The external connection terminals 13 are electrically connected to the I/O and the like of the chip 11 through bonding wires or the like.

On the surface of the sealing body 12 shown in FIG. 1, directions along right and left directions of FIG. 1 are referred to as horizontal directions and directions in up and down directions in FIG. 1 are referred to as vertical directions. In the grid on the surface of the sealing body 12, rows along the horizontal directions are referred to as horizontal rows, and are designated with alphabets "A", "B", . . . . Further, rows along the vertical directions are referred to as vertical rows, and are designated with numbers "1", "2", . . . . In the drawings, the alphabets and the numbers indicating the horizontal and vertical rows are enclosed for the sake of clarity.

When the semiconductor package 10 is viewed from the surface of the sealing body 12, and one of the four corners of the sealing body 12 is located at a left bottom, the horizontal row (line) that is closest to the left bottom corner (i.e., the bottom row in FIG. 1) is referred to as the horizontal row A. The horizontal rows are referred to as the horizontal rows B, C, . . . AA, AB, . . . as a function of distance from the horizontal row A. It is to be noted that the alphabets "I", "O", "Q", "S", "X", and "Z" are not used for indicating the horizontal rows. The vertical row that is closest to the left bottom corner (i.e., the left row in FIG. 1) is referred to as the vertical row 1. The vertical rows are referred to as the vertical rows 2, 3, . . . as a function of distance from the vertical row 1.

In the present embodiment, the external connection terminals 13 are located on intersections of the horizontal rows and the vertical rows of the grid on the sealing body 12. The respective external connection terminal 13 is indicated by an alphanumeric of the horizontal row and the vertical row, that is, in combination of the alphabet of the horizontal row and the number of the vertical row. For example, an external connection terminal 13 (e.g., the left bottom terminal 13) is referred to as "the external connection terminal 13 located at A1", "the external connection terminal 13 of the position A1", or "the A1 external connection terminal 13".

In the present embodiment, the grid on the surface of the sealing body 12 is defined by fifteen horizontal rows, such as the horizontal rows A to R, and fifteen vertical rows, such as the vertical rows 1 to 15.

In the horizontal rows A, B, P, and R, the external connection terminals 13 are arranged on the positions of the vertical rows 1 to 15.

In the horizontal rows C and N, the external connection terminals 13 are arranged on the positions of the vertical rows 1, 2, 14 and 15, but are not arranged on the positions of the vertical rows 3 to 13.

In the horizontal rows D and M, the external connection terminals 13 are arranged on the positions of the vertical rows 1, 2, 4 to 12, 14 and 15, but are not arranged on the positions of the vertical rows 3 and 13.

In the horizontal rows E, F, G, H, J, K, and L, the external connection terminals 13 are arranged on the positions of the vertical rows 1, 2, 4, 12, 14 and 15, but are not arranged on the positions of the vertical rows 3, 5 to 11 and 13.

Namely, the external connection terminals 13 are arranged on a first outer square, a second outer square, and a fourth outer square of the grid on the sealing body 12, but are not arranged on a third outer square and a fifth outer square of the grid on the sealing body 12. The first outer square is an outermost square or an outermost lap of the grid, and is defined by the horizontal and vertical rows A, 1, R, and 15. The second outer square is a second square from outside, that is, one lap inside from the first outer square, and is defined by the horizontal and vertical rows B, 2, P, and 14. The fourth outer square is a fourth square from outside, and is defined by the horizontal and vertical rows D, 4, M, and 12. The third outer square is a third square from outside, and is defined by the horizontal and vertical rows C, 3, N and 13. The fifth outer square is a fifth square from outside, and is defined by the horizontal and vertical rows E, 5, L, and 11.

As shown in FIG. 1, in the horizontal rows F, G, H, J, and K, heat radiation terminals 14 are arranged on the positions of the vertical rows 6 to 10. Similar to the external connection terminals 13, the heat radiation terminals 14 are formed into a spherical shape by a solder, and are partly exposed from the surface of the sealing body 12. The heat radiation terminals 14 are located adjacent the chip 11, and/or electrically connected to a grounded portion (low potential side) of the chip 11.

Figure 8:
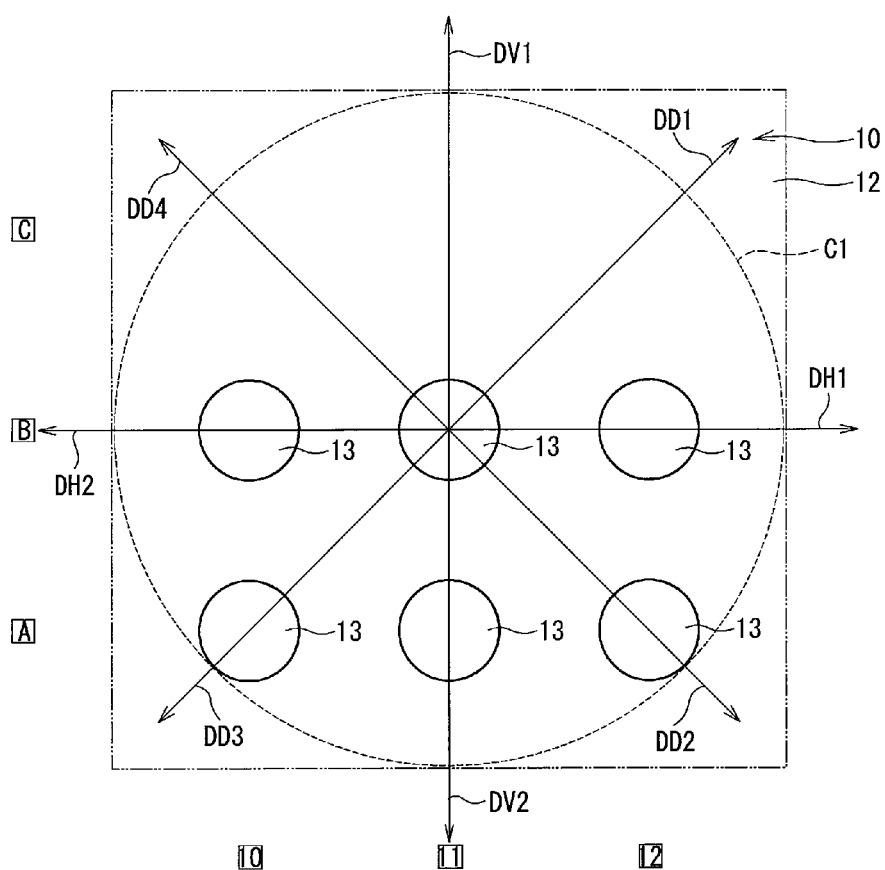
FIG. 8 is an enlarged view of a part VIII in FIG. 1.

FIG. 8 is an enlarged view of a part VIII in FIG. 1. On the surface of the sealing body 12, eight directions are defined from each external connection terminal 13, such as the B11 external connection terminal 13. The eight directions include two horizontal directions DH1, DH2 along the horizontal row, two vertical directions DV1, DV2 along the vertical row, and four diagonal directions DD1, DD2, DD3, DD4 between the horizontal directions DH1, DH2 and the vertical directions DV1, DV2. The horizontal directions DH1, DH2 correspond to first linear directions or second linear directions perpendicular to the first linear directions, and the vertical directions DV1, DV2 correspond to the second linear directions or the first linear directions.

In the horizontal row C, the external connection terminals 13 are not arranged on the positions of the vertical rows 10, 11, and 12. That is, when viewed based on the B11 external connection terminal 13, the external connection terminals 13 are arranged in the five directions, but are not arranged in three directions, such as in the directions DD1, DV1, and DD4, within a predetermined area encircled with a dashed line C1 in FIG. 8.

In the present embodiment, as shown in FIG. 1, in regard to all of the external connection terminals 13 disposed on the surface of the sealing body 12, another external connection terminal 13 is not arranged within a predetermined area in at least one direction of the eight directions from each external connection terminal 13. In other words, each of the external connection terminals 13 is adjacent to a vacant area that is vacant of another external connection terminal 13 in at least one direction of the eight directions.

Next, an arrangement of the pads 40 of the wiring board 1 will be described in detail.

As shown in FIG. 3, the pads 40 are arranged in a grid on the first surface 31 of the substrate 30. Similar to the surface wirings 50, the pads 40 are made of a metal thin film, such as a copper thin film, and are disposed on the first surface 31 of the substrate 30. In the present embodiment, the pads 40 are formed on the first surface 31 of the substrate 30 such as by photolithography, etching or the like. The pads 40 have a circular shape, when viewed in a direction perpendicular to a planar direction of the substrate 30, that is, when viewed in a thickness direction of the substrate 30. Further, the pads 40 have a substantially trapezoidal shape in a cross-section including a center axis, as shown in FIG. 9B.

The pads 40 are disposed on the first surface 31 of the substrate 30 to correspond to the external connection terminals 13 of the semiconductor package 10. Therefore, the pads 40 and the external connection terminals 13 can be electrically connected to each other.

For the sake of explanation, on the first surface 31 of the substrate 30 shown in FIG. 3, directions in right and left directions in FIG. 3 are referred to as horizontal directions and directions in up and down directions in FIG. 3 are referred to as vertical directions. In the grid of the pads 40, rows along the horizontal directions are referred to as horizontal rows, and are designated with alphabets "A", "B", .... Further, rows along the vertical directions are referred to as vertical rows, and are designated with numbers "1", "2", .... In the drawings, the alphabets and the numbers indicating the horizontal and vertical rows are enclosed for the sake of clarity.

The horizontal rows and the vertical rows of the grid on the first surface 31 of the substrate 30 are defined to correspond to the horizontal rows and the vertical rows of the grid on the sealing body 12 shown in FIG. 1, when the semiconductor package 10 is mounted on the substrate 30 such that the surface of the sealing body 12 on which the external connection terminals 13 are disposed is opposed to the first surface 31 of the substrate 30.

That is, as shown in FIG. 3, when the substrate 30 is viewed from the first surface 31 of the sealing body 12, the horizontal row (line) that is closest to the left upper corner is referred to as the horizontal row A. The horizontal rows are referred to as the horizontal rows B, C, . . . AA, AB, . . . as a function of distance from the horizontal row A downwardly. It is to be noted that the alphabets "I", "O", "Q", "S", "X", and "Z" are not used for indicating the horizontal rows. The vertical row that is closest to the left upper corner is referred to as the vertical row 1. The vertical rows are referred to as the vertical rows 2, 3, . . . as a function of distance from the vertical row 1 in a rightward direction.

In the present embodiment, the pads 40 are located on the intersections of the horizontal rows and the vertical rows of the grid on the first surface 31 of the substrate 30. The respective pad 40 is indicated by the alphanumeric, that is, in combination of the alphabet of the horizontal row and the number of the vertical row, such as "the pad 40 located at A1", "the pad 40 of the position A1", or "the A1 pad 40". The pads 40 are arranged in a grid in an area shown by a dashed line L1 in FIG. 3.

As shown in FIG. 3, in the present embodiment, the grid on the first surface 31 of the substrate 30 is defined by fifteen horizontal rows, such as the horizontal rows A to R, and fifteen vertical rows, such as the vertical rows 1 to 15, to correspond to the grid on the surface of the sealing body 12 of the semiconductor package 10. In the horizontal rows A, B, P, and R, the pads 40 are arranged on the positions of the vertical rows 1 to 15.

In the horizontal rows C and N, the pad 40 are arranged on the positions of the vertical rows 1, 2, 14 and 15, but are not arranged on the positions of the vertical rows 3 to 13.

In the horizontal rows D and M, the pads 40 are arranged on the positions of the vertical rows 1, 2, 4 to 12, 14 and 15, but are not arranged on the positions of the vertical rows 3 and 13.

In the horizontal rows E, F, G, H, J, K, and L, the pads 40 are arranged on the positions of the vertical rows 1, 2, 4, 12, 14 and 15, but are not arranged on the positions of the vertical rows 3, 5 to 11 and 13.

Namely, the pads 40 are arranged on a first outer square, a second outer square, and a fourth outer square of the grid on the substrate 30, but are not arranged on a third outer square and a fifth outer square of the grid. The first outer square is an outermost square or an outermost lap of the grid, and is defined by the horizontal and vertical rows A, 1, R, and 15. The second outer square is a second square one lap inside from the first outer square, and is defined by the horizontal and vertical rows B, 2, P, and 14. The fourth outer square is a fourth square inside from the first outer square, and is defined on the horizontal and vertical rows D, 4, M, and 12. The third outer square is a third square inside from the first outer square, and is defined by the horizontal and vertical rows C, 3, N and 13. The fifth outer square is a fifth square inside from the first outer square, and is defined by the horizontal and vertical rows E, 5, L, and 11.

As shown in FIG. 3, in the horizontal rows F, G, H, J, and K, heat radiation pads 90 are arranged on the positions of the vertical rows 6 to 10. Similar to the pads 40, the heat radiation pads 90 are made of a metal thin film, such as a copper film. The heat radiation pads 90 are disposed on the first surface 31 of the substrate 30. The heat radiation pads 90 are connected to a heat sink (not shown) of the rotary electric machine 2, for example.

The pads 40 is not arranged on an outer extended square that is one lap outside of the first outer square of the grid on the substrate 30. In the present embodiment, on the squares on the grid of the substrate 30 and the outer extended square, areas where the pads 40 are not arranged are provided as shown by a single dashed chain line 35 in FIGS. 3 and 9, and are referred to as the "specific areas 35".

As shown in FIG. 3, the specific areas 35 are provided on the outer extended square, the third outer square (square defined by the horizontal and vertical rows C, 3, N, 13), and the fifth outer square (square defined by the horizontal and vertical rows E, 5, L, 11).

Figure 9A:
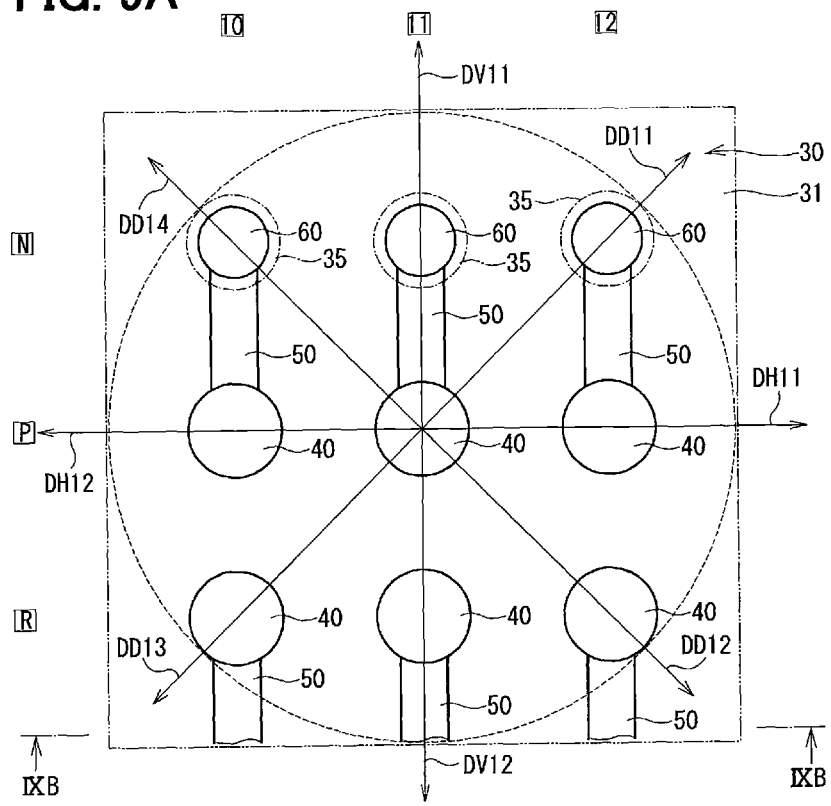
FIG. 9A is an enlarged view of a part IXA in FIG. 3.
Figure 9B:
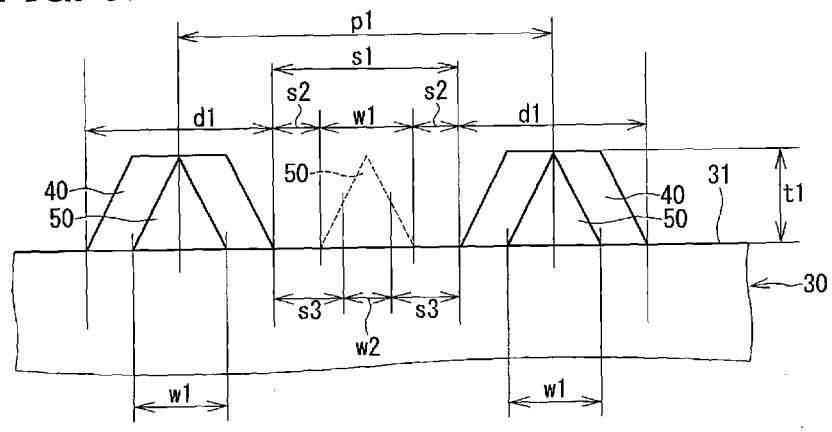
FIG. 9B is a schematic cross-sectional view taken along a line IXB-IXB in FIG. 9A.

FIG. 9A is an enlarged view of a part IXA in FIG. 3. On the first surface 31 of the substrate 30, eight directions are defined from each pad 40, such as the P11 pad 40. The eight directions include two horizontal directions DH11, DH12 along the horizontal rows, two vertical directions DV11, DV12 along the vertical rows, and four diagonal directions DD11, DD12, DD13, and DD14 between the horizontal directions DH11, DH12 and the vertical directions DV11, DV12. The horizontal directions DH11, DH12 correspond to first linear directions or second linear directions perpendicular to the first linear directions, and the vertical directions DV11, DV12 correspond to the second linear directions or the first linear directions.

In the present embodiment, in the horizontal row N, the specific areas 35 are formed on the positions of the vertical rows 10, 11, and 12. That is, when viewed based on the P11 pad 40, the specific areas 35 are located in three directions of the eight directions from the P11 pad 40 in a predetermined area (i.e., an area indicated by a circle of a dashed line in FIG. 9A).

In the present embodiment, as shown in FIG. 3, in regard to all of the pads 40, the specific area 35 where another pad 40 is not arranged is provided within a predetermined area on a periphery of each pad 40 in at least one direction of the eight directions. In other words, each pad 40 is adjacent to the specific area 35 vacant of another pad 40 within the predetermined area in at least one direction of the eight directions.

The surface wirings 50 include surface wirings (referred to as the first surface wirings) connected to the pads 40 of the first outer square surface wirings, surface wirings (referred to as the second surface wirings) connected to the pads 40 on the second outer square, and surface wirings (referred to as the third surface wirings) connected to the fourth outer square.

Each of the first surface wirings 50 has a first end electrically connected to corresponding one of the pads 40 that is located on the first outer square (square defined by the horizontal and vertical rows A, 1, R, and 15), and extends toward the outer extended square so that a second end passes through the specific area 35 on the outer extended square.

Each of the second surface wirings 50 has a first end electrically connected to corresponding one of the pads 40 that is located on the second outer square (square defined by the horizontal and vertical rows B, 2, P, and 14), and extends toward the third outer square so that a second end is located in the specific area 35 on the third outer square.

Each of the third surface wirings 50 has a first end electrically connected to corresponding one of the pads 40 that is located on the fourth outer square (square defined by the horizontal and vertical rows D, 4, M, and 12), and extends toward the fifth outer square so that a second end is located in the specific area 35 of the fifth outer square.

The vias 60 are made of a metal such as copper. As shown in FIG. 4, the vias 60 are provided by copper-plating formed in holes of the substrate 30, the holes extending in the thickness direction of the substrate 30. Each of the vias 60 has a first end exposing from the first surface 31 of the substrate 30. The via 60 extends from the first surface 31 toward a second surface 32 of the substrate 30.

As shown in FIG. 5, the vias 60 are arranged in the specific areas 35 located on the third outer square (square defined by the horizontal and vertical rows C, 3, N, and 13) and the fifth outer square (square defined by the horizontal and vertical rows E, 5, L, and 11) of the grid on the substrate 30. The first end of the via 60 is electrically connected to the second end of the surface wiring 50.

The non-surface wirings 71, 72 are made of a metal thin film, such as a copper thin film. As shown in FIG. 4, the non-surface wiring 71 is disposed between the first surface 31 and the second surface 32 of the substrate 30, that is, disposed within the substrate 30, and is electrically connected to the second end of the via 60. The non-surface wiring 72 is disposed on the second surface 32 of the substrate 30 and is electrically connected to the second end of the via 60. As such, the non-surface wirings 71, 72 are electrically connected to the pads 40 through the vias 60 and the surface wirings 50.

The second end of the first surface wirings 50, which are connected to the pads 40 located on the first outer square (square defined by the horizontal and vertical rows A, 1, R, and 15), and the ends of the non-surface wirings 71, 72 opposite to the vias 60 are electrically connected to the electronic components disposed on the substrate 30. The electronic components include the power modules 20.

In the present embodiment, the semiconductor package 10 is arranged on the first surface 31 of the substrate 30 such that the external connection terminals 13 and the heat radiation terminals 14 correspond to the pads 40 and the heat radiation pads 90. The external connection terminals 13 and the heat radiation terminals 14 are melted by reflowing or the like. As a result, the external connection terminals 13 are electrically connected to the pads 40. As such, the semiconductor package 10 can receive and transmit signals from and to the external devices, such as the electronic components including the power modules 20, through the external connection terminals 13, the pads 40, the surface wirings 50, the vias 60 and the non-surface wirings 71, 72.

Further, the heat radiation terminals 14 are connected to the heat radiation pad 90. Therefore, heat generated from the chip 11 when the chip 11 is in operation can be radiated to the heat sink through the heat radiation terminals 14 and the heat radiation pads 90. The heat radiation terminals 14 and the heat radiation pads 90 may also be used as ground terminals.

In the present embodiment, as shown in FIG. 9B, the pads 40 and the surface wirings 50 have the same thickness t1. The thickness t1 is, for example, approximately 0.07 mm. Further, the thickness t1 of the surface wiring 50 is the same as the thickness of the power wiring 80. The width w1 of the surface wiring 50 is set to a predetermined width that can ensure a predetermined strength relative to the thickness t1. For example, the width w1 of the surface wiring 50 is approximately 0.2 mm. It is to be noted that, in FIG. 9B, the pads 40 and the surface wiring 50 are illustrated with a dimension ratio different from an actual dimension ratio thereof, for the sake of explanation.

In the present embodiment, the outer diameter d1 of the pad 40 is, for example, 0.4 mm. The pitch p1 of the pads 40 is, for example, 0.8 mm. In this case, the pitch p1 is defined by a distance between centers of the adjacent pads 40, and corresponds to a distance between the two horizontal rows of the grid or the vertical rows of the grid. A shortest distance s1 between the pads 40 adjacent in the horizontal direction or in the vertical direction, that is, a minimum value of a clearance between the adjacent pads 40 is approximately 0.4 mm.

If the surface wiring 50 is arranged at a middle position between the adjacent pads 40, as shown by a dashed line in FIG. 9B, a clearance having a width s2 is provided between each side of the surface wiring 50 and the adjacent pad 40. The width s2 of the clearance is, for example, approximately 0.1 mm. In this case, in order to ensure the reliability of the input and output signals of the semiconductor package 10, which flow in the surface wirings 50, a width s3 of the clearance between each side of the surface wiring 50 and the adjacent pad 40 is set, for example, 0.15 mm or more. In order to satisfy this condition, the width w2 of the surface wiring 50 needs to be set 0.1 mm or less.

In the present embodiment, on the other hand, the width w1 of the surface wiring 50 is greater than the width w2, and is approximately 0.2 mm, as described above. That is, the width w1 of the surface wiring 50 is greater than the width w2 that is provided by subtracting the width s3 of the clearances, which need to be maintained between both the sides of the surface wiring 50 and the adjacent pads 40 when the surface wiring 50 is arranged between the adjacent pads 40, from the shortest distance s1 between the adjacent pads 40. In this case, it is not suitable to arrange the surface wiring 50 between the adjacent pads 40, because the reliability of the signals flowing in the surface wiring 50 is likely to be reduced. In the present embodiment, therefore, the surface wiring 50 and the via 60 are not arranged between the pads 40 that are adjacent in the horizontal direction or in the vertical direction across the clearance with the width s1, as shown in FIG. 3.

In the present embodiment, the surface wirings 50 are not connected to the pads 40 located at the positions B2, B3, B13, B14, D4, D5, D11, D12, M4, M5, M11, M12, P2, P3, P13, and P14. These pads 40 and the external connection terminals 13 corresponding to these pads 40 are not used to conduct the signals between the semiconductor package 10 and the external devices.

In the present embodiment as described above, the semiconductor package 10 includes the chip 11, the sealing body 12 and the external connection terminals 13. The sealing body 12 covers the chip 11. The external connection terminals 13 are connected to the chip 11 and are partly exposed from the surface of the sealing body 12. Further, the external connection terminals 13 are arranged in the grid on the surface of the sealing body 12.

In the grid, all of the external connection terminals 13 are disposed in such a manner that, on a periphery of each of the external connection terminals 13, there is an area where another external connection terminal 13 is not arranged in at least one direction of the eight directions. In other words, in the arrangement of the external connection terminals 13, each external connection terminal 13 is adjacent to the area vacant of the other external connection terminals 13 within the predetermined area in at least one direction of the eight directions thereof.

The semiconductor package 10 is disposed on the wiring board 1. The wiring board 1 includes the substrate 30, the pads 40 and the surface wirings 50. The semiconductor package 10 is mounted on a package arrangement area of the first surface 31 of the substrate 30. The pads 40 are arranged on the first surface 31 of the substrate 30 to correspond to the external connection terminals 13. The pads 40 are electrically connected to the external connection terminals 13. The surface wirings 50 are disposed on the first surface 31 of the substrate 30, and the first ends of the surface wirings 50 are electrically connected to the pads 40.

On the first surface 31 of the substrate 30, there are specific areas 35 where the pads 40 are not arranged. The specific area 35 is formed in a predetermined area defined in at least one direction of the eight directions from each of the pads 40. In other words, each pad 40 is adjacent to the specific area 35 vacant of the other pads 40 within the predetermined area in at least one direction of the eight directions.

When the semiconductor package 10 is disposed on the wiring board 1, the surface wirings 50 are disposed in or adjacent to the specific areas 35. Accordingly, the surface wirings 50 are easily extended from any pads 40 without contacting the other pads 40.

In the semiconductor package 10 of the present embodiment, the arrangement of the external connection terminals 13 on the surface of the sealing body 12 is devised, as discussed above. Therefore, in the wiring board 1 on which the semiconductor package 10 is mounted, the surface wirings 50 can be easily extended from any pads 40 without contacting the other pads 40. As such, the reliability of the input signals and the output signals of the semiconductor packages 10 flowing in the surface wirings 50 can be ensured.

In the present embodiment, the substrate 30 has the first surface 31 on which the semiconductor package 10 is mounted. The pads 40 are disposed on the first surface 31 of the substrate 30 to correspond to the external connection terminals 13 of the semiconductor package 10. The pads 40 are electrically connected to the external connection terminals 13. The surface wirings 50 are disposed on the first surface 31 of the substrate 30, and the first ends of the surface wirings 50 are electrically connected to the pads 40. The width of the surface wirings 50 is set to the width w1 that is greater than the predetermined value w2.

The pads 40 are arranged in such a manner that each pad 40 is adjacent to the specific area 35 vacant of the other pads 40 within the predetermined area at least in one direction of the eight directions from each pad 40. That is, on the periphery of each of the pads 40, no pad 40 is arranged in the predetermined area in at least one direction of the eight directions.

The width of the surface wirings 50 is set to the width w1, which is greater than the predetermined value w2. Therefore, there is a possibility that the surface wiring 50 cannot be arranged between the adjacent pads 40 depending on the width s1 of the clearance between the adjacent pads 40. In the present embodiment, at least one specific area 35 vacant of the pads 40 is provided for each of the pads 40. Therefore, the surface wiring 50 can be arranged in the specific area 35 or in the vicinity of the specific area 35. As such, the surface wiring 50 can be easily extended from any pad 40 without contacting with the other pads 40.

The wiring board 1 includes the vias 60 and the non-surface wirings 71, 72. Each of the vias 60 has the first end exposing on the first surface 31 of the substrate 30. The via 60 extends from the first surface 31 of the substrate 30 toward the second surface 32 of the substrate 30 to be electrically connected to the non-surface wirings 71 or the non-surface wiring 72. The non-surface wiring 71 is disposed in between the first surface 31 and the second surface 32. The non-surface wiring 72 is disposed on the second surface 32 of the substrate 30. With this configuration, the semiconductor package 10 can receive and provide the signals from and to the external devices through the external connection terminals 13, the pads 40, the surface wirings 50, the vias 60, and the non-surface wirings 71, 72.

The predetermined value w2 is a value obtained by subtracting the width s3 of the clearances to be kept on the opposite sides of the surface wiring 50 between the adjacent pads 40 from the shortest distance s1 between the adjacent pads 40. The width s3 of the clearance to be kept is the value set so as to ensure the reliability of the input and output signals of the semiconductor package 10, which flow in the surface wiring 50 disposed between the adjacent pads 40.

In the present embodiment, the surface wiring 50 having the width w1, which is greater than the predetermined value w2, is not arranged between the pads 40 that are adjacent to each other at the distance s1. Therefore, the reliability of the input and output signals of the semiconductor package 10, which flow in the surface wirings 50, can be ensured while keeping the width w1 of the surface wiring 50 greater than the predetermined value w2.

The wiring board 1 has the power wirings 80. The power wirings 80 are disposed on the first surface 31 of the substrate 30, and allow the electric current to flow to be supplied to the rotary electric machine 2, which is controlled by the semiconductor package 10. That is, the power wirings 80 and the surface wirings 50 are disposed on the same first surface 31 of the substrate 30. Since the electric current having a large value may flow in the power wirings 80, the thickness of the power wirings 80 is relatively large. The thickness of the power wiring 80 is approximately 0.07 mm.

In the case where the power wirings 80 are disposed on the first surface 31 of the substrate 30, the thickness t1 of the surface wirings 50 is set to be the same as the thickness of the power wirings 80 for sharing the members or parts. Namely, the thickness of the surface wirings 50 is set to a large value, such as approximately 0.07 mm.

In the case where the thickness t1 of the surface wirings 50 is large, it is necessary to increase the width w1 of the surface wirings 50 to be greater than the predetermined width so as to ensure a predetermined strength. Therefore, the present embodiment described above is suitable to a structure where the power wirings 80 and the surface wirings 50 having the width w1 greater than the predetermined width are disposed on the first surface 31 of the substrate 30.

The object to be controlled by the semiconductor package 10 is the rotary electric machine 2 of the electric power steering apparatus 109 for outputting the steering assist torque. Therefore, the electric current with a large value may flow in the power wirings 80. In such a case, it is desirable to increase the thickness of the power wirings 80 to be greater than the predetermined thickness. The thickness of the surface wirings 50 is set greater than the predetermined thickness according to the thickness of the power wirings 80. Also, the width of the surface wirings 50 is set greater than the predetermined width. The operation of the rotary electric machine 2 may affect the safety of travelling of the vehicle or the like. Therefore, it is necessary to ensure the reliability of the signals flowing in the surface wirings 50.

In the present embodiment, the surface wirings 50 are arranged without passing through in between the pads 40 that are adjacent to each other at the distance s1. Therefore, the wiring board 1 of the present embodiment is suitably used for the rotary electric machine 2 of the electric power steering apparatus 109, since the width of the surface wirings 50 is set greater than the predetermined width and the reliability of the signals flowing in the surface wirings 50 can be ensured.

Second Embodiment

Figure 10:
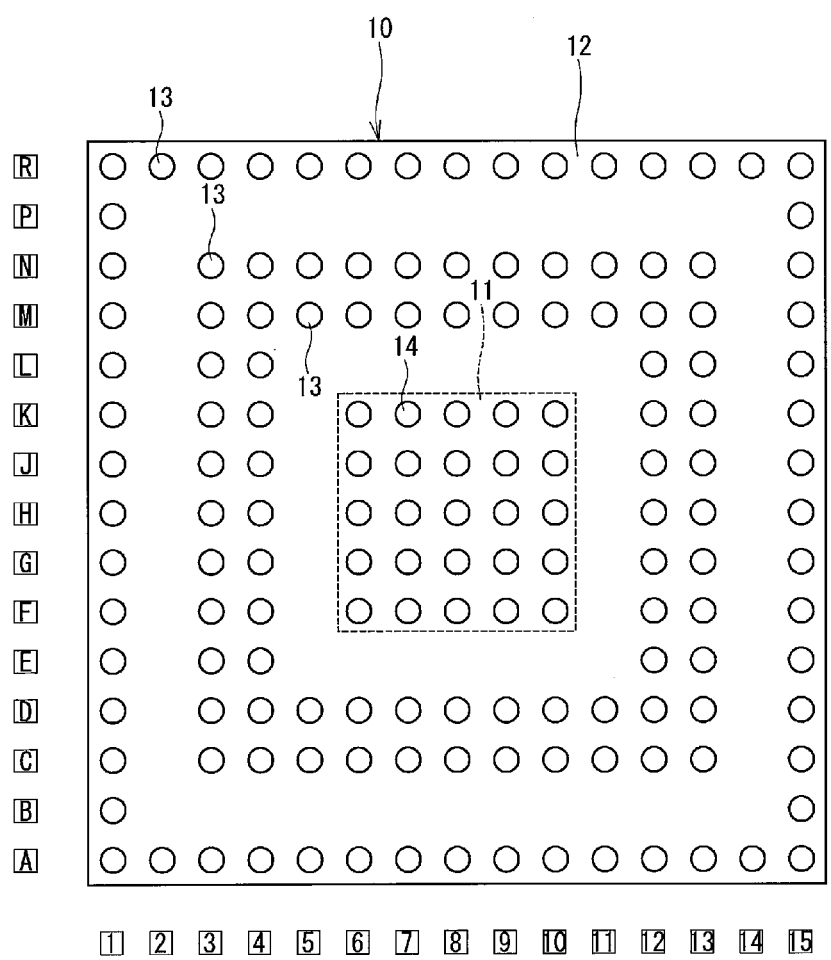
FIG. 10 is a plan view of a semiconductor package to be mounted on a wiring board according to a second embodiment of the present disclosure.
Figure 11:
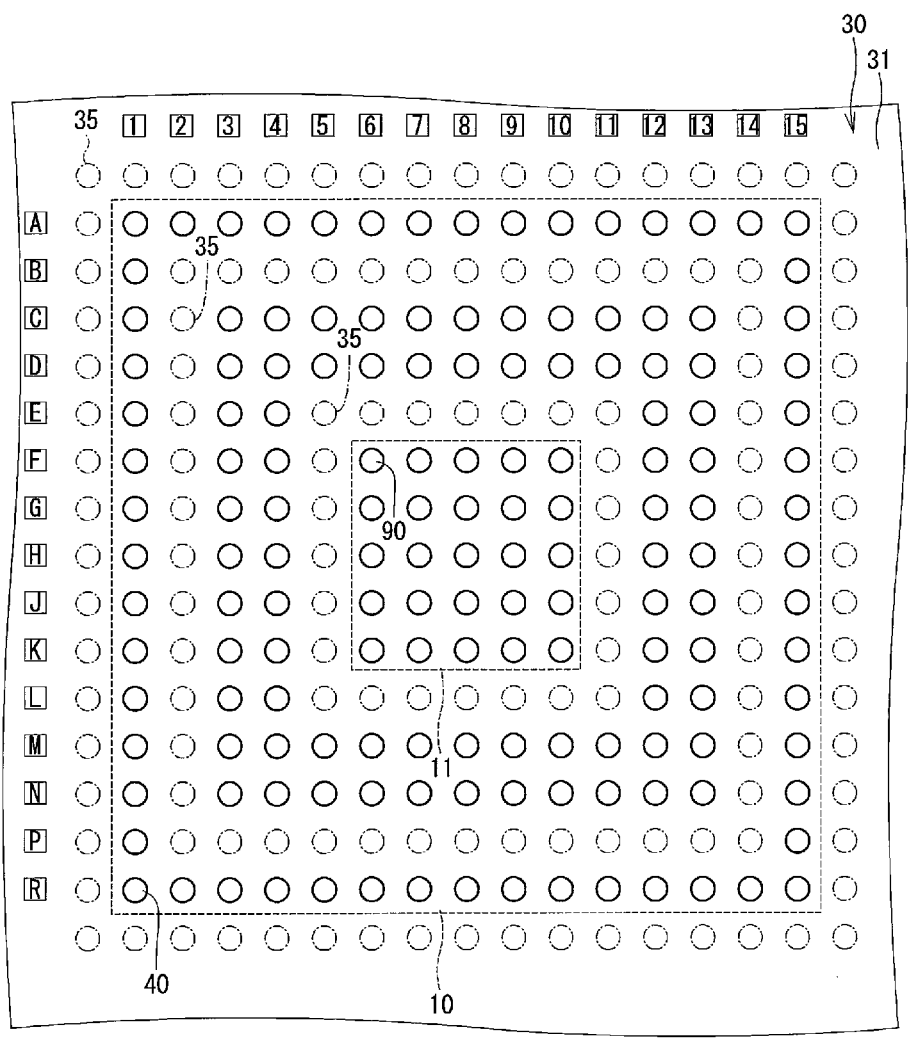
FIG. 11 is a plan view of a part of the wiring board corresponding to an area where the semiconductor package is mounted, according to the second embodiment.

A semiconductor package 10 of a second embodiment of the present disclosure is illustrated in FIG. 10. A part of a wiring board of the second embodiment is illustrated in FIG. 11.

In the second embodiment, the arrangement of the external connection terminals 13 on the surface of the sealing body 12 and the arrangement of the pads 40 on the first surface 31 of the substrate 30 are different from those of the first embodiment.

In the second embodiment, as shown in FIG. 10, the external connection terminals 13 are arranged on the positions of the vertical rows 1 to 15, in the horizontal rows A and R.

In the horizontal rows B and P, the external connection terminals 13 are arranged on the positions of the vertical rows 1 and 15, but are not arranged on the positions of the vertical rows 2 to 14.

In the horizontal rows C, D, M, and N, the external connection terminals 13 are arranged on the positions of the vertical row 1, 3 to 13, and 15, but are not arranged on the positions of the vertical rows 2 and 14.

In the horizontal rows E, F, G, H, J, K, and L, the external connection terminals 13 are arranged on the positions of the vertical rows 1, 3, 4, 12, 13 and 15, but are not arranged on the positions of the vertical rows 2, 5 to 11, and 14.

Namely, the external connection terminals 13 are arranged on the first outer square, the third outer square, and the fourth outer square of the grid on the surface of the sealing body 12, but are not arranged on the second outer square and the fifth outer square of the grid. The first outer square is the outermost square or the outermost lap, and is defined by the horizontal and vertical rows A, 1, R and 15. The third outer square is defined by the horizontal and vertical rows C, 3, N, and 13. The fourth outer square is defined by the horizontal and vertical rows D, 4, M and 12. The second outer square is defined by the horizontal and vertical rows B, 2, P and 14. The fifth outer square is defined by the horizontal and vertical rows E, 5, L, and 11.

In the present embodiment, the external connection terminals 13 are not arranged on the second outer square and the fifth outer square on the grid of the sealing body 12.

That is, on a periphery of each of the external connection terminals 13, there is an area where another external connection terminal 13 is not arranged in at least one direction of the eight directions. In other words, in the arrangement of the external connection terminals 13, each external connection terminal 13 is adjacent to the area vacant of the other external connection terminals 13 within the predetermined area in at least one direction of the eight directions thereof.

As shown in FIG. 11, in the horizontal rows A and R, the pads 40 are arranged on the positions of the vertical rows 1 to 15.

In the horizontal rows B and P, the pads 40 are arranged on the positions of the vertical rows 1 and 15, but are not arranged on the positions of the vertical rows 2 to 14.

In the horizontal rows C, D, M and N, the pads 40 are arranged on the positions of the vertical rows 1, 3 to 13 and 15, but are not arranged on the positions of the vertical rows 2 and 14.

In the horizontal rows E, F, G, H, J, K, and L, the pads 40 are arranged on the positions of the vertical rows 1, 3, 4, 12, 13, and 15, but are not arranged on the positions of the vertical rows 2, 5 to 11 and 14.

Namely, the pads 40 are arranged on the first outer square, the third outer square, and the fourth outer square of the grid on the first surface 31 of the substrate 30, but are not arranged on the second outer square and the fifth outer square of the grid. The first outer square is the outermost square or the outermost lap and is defined by the horizontal and vertical rows A, 1, R and 15. The third outer square is defined by the horizontal and vertical rows C, 3, N, and 13. The fourth outer square is defined by the horizontal and vertical rows D, 4, M and 12. The second outer square is defined by the horizontal and vertical rows B, 2, P and 14. The fifth outer square is defined by the horizontal and vertical rows E, 5, L, and 11.

In the present embodiment, the specific areas 35 are provided on an outer extended square, the second outer square, and the fifth outer square. The outer extended square is defined by horizontal and vertical rows further extended outside from the first outer square of the grid of the substrate 30. The second outer square is defined by the horizontal and vertical rows B, 2, P, and 14. The fifth outer square is defined by the horizontal and vertical rows E, 5, L and 11.

On the first surface 31 of the substrate 30, there are specific areas 35 where the pads 40 are not arranged. The specific area 35 is formed in a predetermined area defined in at least one direction of the eight directions from each of the pads 40. In other words, each pad 40 is adjacent to the specific area 35 vacant of the other pads 40 within the predetermined area in at least one direction of the eight directions.

Also in the second embodiment, the advantageous effects similar to the first embodiment will be achieved.

It is to be noted that, in FIG. 11, illustrations of the surface wirings 50 and the vias 60 are omitted.

Third Embodiment

Figure 12:
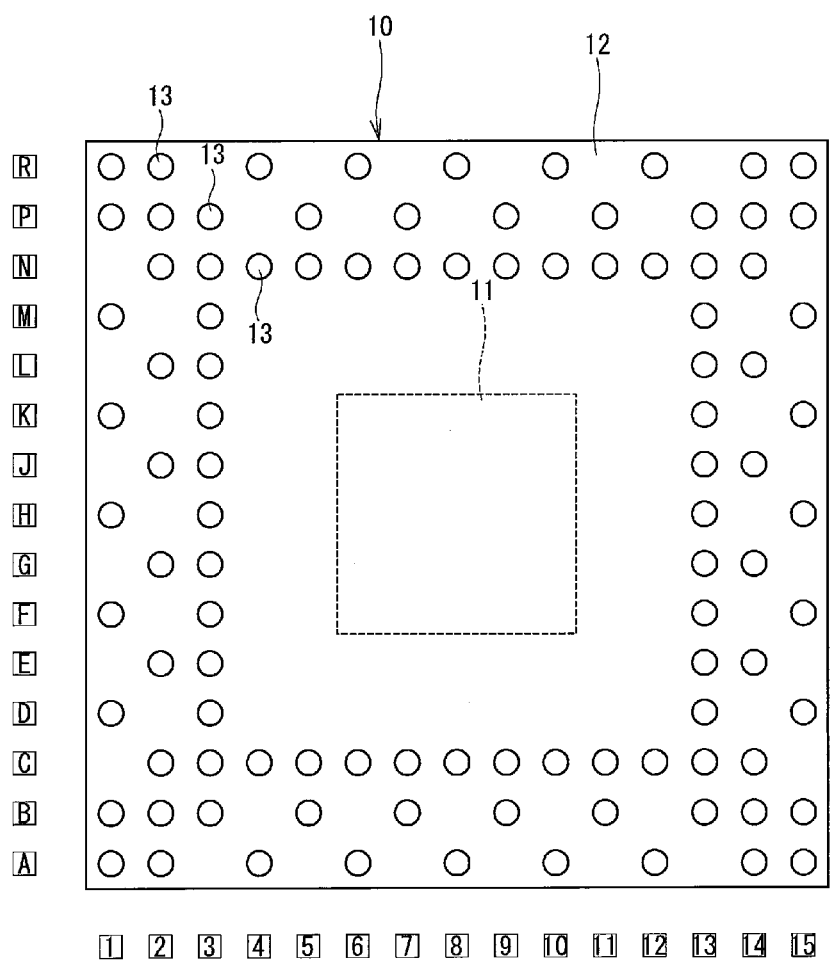
FIG. 12 is a plan view of a semiconductor package to be mounted on a wiring board according to a third embodiment of the present disclosure.
Figure 13:
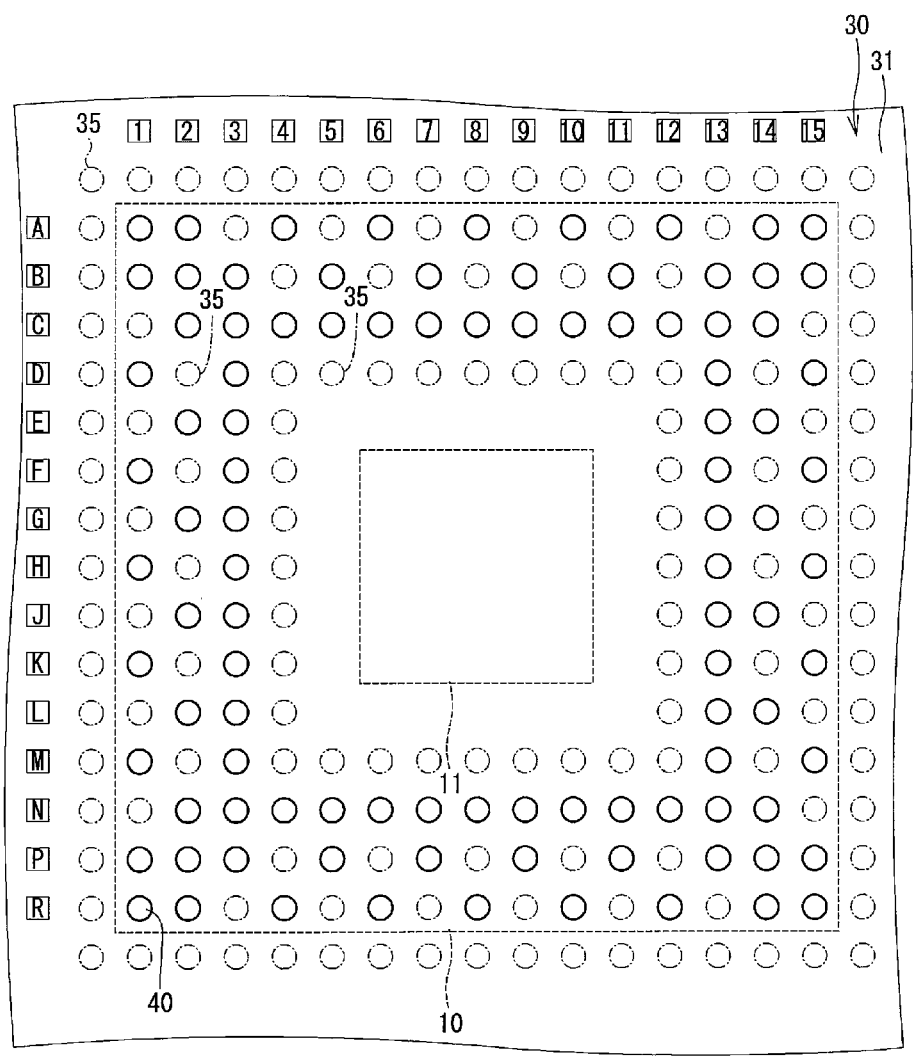
FIG. 13 is a plan view of a part of the wiring board corresponding to an area where the semiconductor package is mounted, according to the third embodiment.

A semiconductor package of a third embodiment is illustrated in FIG. 12, and a part of a wiring substrate of the third embodiment is illustrated in FIG. 13.

In the third embodiment, the arrangement of the external connection terminals 13 on the surface of the sealing body 12 and the arrangement of the pads 40 on the first surface 31 of the substrate 30 are different from those of the first embodiment.

As shown in FIG. 12, in the horizontal rows A and R, the external connection terminals are arranged on the positions of the vertical rows 1, 2, 4, 6, 8, 10, 12, 14 and 15, but are not arranged on the positions of the vertical rows 3, 5, 7, 9, 11 and 13.

In the horizontal rows B and P, the external connection terminals are arranged on the positions of the vertical rows 1, 2, 3, 5, 7, 9, 11, 13, 14 and 15, but are not arranged on the positions of the vertical rows 4, 6, 8, 10 and 12.

In the horizontal rows C and N, the external connection terminals are arranged on the positions of the vertical rows 2 to 14, but are not arranged on the positions of the vertical rows 1 and 15.

In the horizontal rows D, F, H, K and M, the external connection terminals are arranged on the positions of the vertical rows 1, 3, 13 and 15, but are not arranged on the positions of the vertical rows 2, 4 to 12, and 14.

In the horizontal rows E, G, J and L, the external connection terminals are arranged on the positions of the vertical rows 2, 3, 13, and 14, but are not arranged on the positions of the vertical rows 1, 4 to 12 and 15.

In the present embodiment, the external connection terminals 13 are not arranged on the fourth outer square, and on the positions A3, A5, A7, A9, A11, A13, B4, B6, B8, B10, B12, C1, C15, D2, D14, E1, E15, F2, F14, G1, G15, H2, H14, J1, J15, K2, K14, L1, L15, M2, M14, N1, N15, P4, P6, P8, P10, P12, R3, R5, R7, R9, R11, and R13, on the grid of the surface of the sealing body 12. The fourth outer square is defined by the horizontal and vertical rows D, 4, M and 12.

That is, on a periphery of each of the external connection terminals 13, there is an area where another external connection terminal 13 is not arranged in at least one direction of the eight directions. In other words, in the arrangement of the external connection terminals 13, each external connection terminal 13 is adjacent to the area vacant of the other external connection terminals 13 within the predetermined area in at least one direction of the eight directions thereof.

As shown in FIG. 13, in the horizontal rows A and R, the pads 40 are arranged on the positions of the vertical rows 1, 2, 4, 6, 8, 10, 12, 14 and 15, but are not arranged on the positions of the vertical rows 3, 5, 7, 9, 11 and 13.

In the horizontal rows B and P, the pads 40 are arranged on the positions of the vertical rows 1, 2, 3, 5, 7, 9, 11, 13, 14 and 15, but are not arranged on the positions of the vertical rows 4, 6, 8, 10 and 12.

In the horizontal rows C and N, the pads 40 are arranged on the positions of the vertical rows 2 to 14, but are not arranged on the positions of the vertical rows 1 and 15.

In the horizontal rows D, F, H, K, and M, the pads 40 are arranged on the positions of the vertical rows 1, 3, 13, and 15, but are not arranged on the positions of the vertical rows 2, 4 to 12, and 14.

In the horizontal rows E, G, J and L, the pads 40 are arranged on the positions of the vertical rows 2, 3, 13 and 14, but are not arranged on the positions of the vertical rows 1, 4 to 12 and 15.

In the present embodiment, the specific areas 35 are located on the outer extended square, the fourth outer square, and on the positions A3, A5, A7, A9, A11, A13, B4, B6, B8, B10, B12, C1, C15, D2, D14, E1, E15, F2, F14, G1, G15, H2, H14, J1, J15, K2, K14, L1, L15, M2, M14, N1, N15, P4, P6, P8, P10, P12, R3, R5, R7, R9, R11, and R13, on the grid of the first surface 31 of the substrate 30. The outer extended square is defined by the square extended outside of the first outer square defined by the horizontal and vertical rows A, 1, R, 15. The fourth outer square is defined by the horizontal and vertical rows D, 4, M and 12.

That is, on the first surface 31 of the substrate 30, there are specific areas 35 where the pads 40 are not arranged. The specific area 35 is formed in a predetermined area defined in at least one direction of the eight directions from each of the pads 40. In other words, each pad 40 is adjacent to the specific area 35 vacant of the other pads 40 within the predetermined area in at least one direction of the eight directions.

With this configuration, the advantageous effects similar to the first embodiment will be achieved also in the third embodiment.

In the third embodiment, the sealing body 12 is not provided with the heat radiation terminals 14, which are indicated in the first embodiment. Further, the substrate 30 is not provided with the heat radiation pads 90.

In FIG. 13, illustrations of the surface wirings 50 and the vias 60, which are indicated in the first embodiment, are omitted.

Fourth Embodiment

Figure 14:
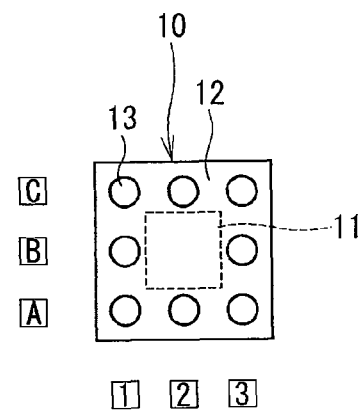
FIG. 14 is a plan view of a semiconductor package to be mounted on a wiring board according to a fourth embodiment of the present disclosure.
Figure 15:
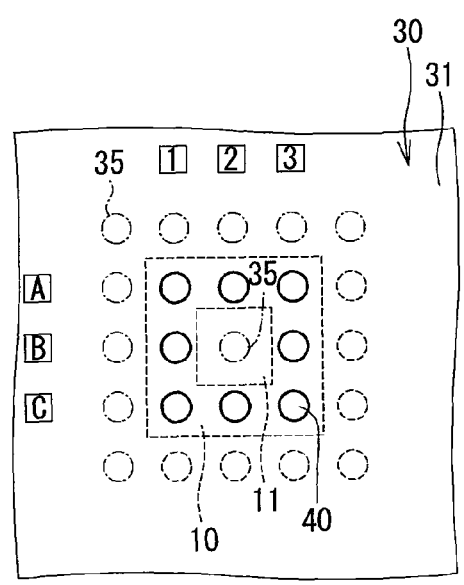
FIG. 15 is a plan view of a part of the wiring board corresponding to an area where the semiconductor package is mounted, according to the fourth embodiment.

A semiconductor package of a fourth embodiment is illustrated in FIG. 14, and a part of a wiring board is illustrated in FIG. 15.

In the fourth embodiment, the size of the sealing body 12, the arrangement of the external connection terminals 13 on the surface of the sealing body 12, and the arrangement of the pads 40 on the first surface 31 of the substrate 30 are different from those of the first embodiment.

As shown in FIG. 14, in the horizontal rows A and C, the external connection terminals 13 are arranged on the positions of the vertical rows 1 to 3.

In the horizontal row B, the external connection terminals 13 are arranged on the positions of the vertical rows 1 to 3, but are not arranged on the position of the vertical row 2.

The external connection terminal 13 is not arranged on the position B2 of the grid on the sealing body 12.

That is, on a periphery of each of the external connection terminals 13, there is an area where another external connection terminal 13 is not arranged in at least one direction of the eight directions. In other words, in the arrangement of the external connection terminals 13, each external connection terminal 13 is adjacent to the area vacant of the other external connection terminals 13 within the predetermined area in at least one direction of the eight directions thereof.

As shown in FIG. 15, in the horizontal rows A and C, the pads 40 are arranged on the positions of the vertical rows 1 to 3.

In the horizontal row B, the pads 40 are arranged on the positions of the vertical rows 1 and 3, but are not arranged on the position of the vertical row 2.

In the present embodiment, the specific areas 35 are located on the outer extended square, and on the position B2. The outer extended square is defined further outside of the first outer square defined by the horizontal and vertical rows A, 1, C and 3.

That is, on the first surface 31 of the substrate 30, there are specific areas 35 where the pads 40 are not arranged. The specific area 35 is formed in a predetermined area defined in at least one direction of the eight directions from each of the pads 40. In other words, each pad 40 is adjacent to the specific area 35 vacant of the other pads 40 within the predetermined area in at least one direction of the eight directions.

With this configuration, the advantageous effects similar to the first embodiment will be achieved in the fourth embodiment.

In the fourth embodiment, the sealing body 12 is not provided with the heat radiation terminals 14, which are indicated in the first embodiment. Also, the substrate 30 is not provided with the heat radiation pads 90, which are indicated in the first embodiment.

In FIG. 15, illustrations of the surface wirings 50 and the vias 60, which are indicated in the first embodiment, are omitted.

Other Embodiments

The present disclosure may not be limited to the embodiments described hereinabove, and may be modified in various other ways, as described hereinafter.

For example, the width of the surface wiring 50 may be set greater than the minimum value of the clearance between the adjacent pads 40. In the case where the width of the surface wiring 50 is greater than the minimum value of the clearance between the adjacent pads 40, it is difficult to arrange the surface wiring 50 between the adjacent pads 40 without contacting the pads. When the specific area 35 is formed in the predetermined area in at least one direction of the eight directions from the respective pad, the surface wiring 50 can be arranged in the specific area 35. Therefore, the surface wiring 50 can have a sufficient width, as well as the reliability of the input and output signals of the semiconductor package 10 can be ensured.

For example, the width of the surface wiring 50 may be set equal to or less than the minimum value of the clearance between the adjacent pads 40. Even in such a structure, when the surface wiring 50 is arranged in the specific area 35 or in the vicinity of the specific area 35, the surface wiring 50 can be easily extended from any pad 40 without contacting the other pads 40.

For example, the wiring board 1 may not have vias 60 and non-surface wirings 71, 72.

For example, the wiring board 1 may not have power wirings 80.

For example, the wiring board 1 may be provided separate from the rotary electric machine 2, which is an object to be controlled by the semiconductor package 10.

For example, the object to be controlled by the semiconductor package 10 may not be limited to the rotary electric machine 2 of the electric power steering apparatus 109 for outputting the steering assist torque. For example, the object to be controlled by the semiconductor package 10 may be a rotary electric machine for driving a compressor of an air conditioner. The object to be controlled by the semiconductor package may be any devices other than the rotary electric machine in which the large value of electric current flows.

For example, the outer diameter and the pitch of the external connection terminals 13 may be set to arbitrary values.

For example, the thicknesses of the pads 40, the surface wirings 50, the non-surface wirings 71, 72 and the power wirings 80 may be set to any arbitrary values.

Further, the outer diameter and the pitch of the pads 40 may be set to arbitrary values.

In the semiconductor package 10 in which the external connection terminals 13 are arranged in the grid, the numbers of the horizontal rows and the vertical rows of the grid may not be limited to specific values, and may be 3 or more, as long as the external connection terminals 13 are not arranged in the predetermined area in at least one direction of the eight directions from each of the external connection terminals 13.

In the substrate 30 in which the pads 40 are arranged in the grid, the numbers of the horizontal rows and the vertical rows of the grid may not be limited to specific values, and may be 3 or more, as long as the specific area 35 in which the pads are not arranged is formed in the predetermined area in at least one direction of the eight directions from each pad 40.

For example, the semiconductor package 10 may not be limited to the BGA type. The semiconductor package 10 may be any other type, such as a land grid array (LGA) type, as long as the external connection terminals are arranged in the grid.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A semiconductor package comprising:
    a chip;
    a sealing body covering the chip; and
    a plurality of external connection terminals being electrically connected to the chip and exposed from a surface of the sealing body, the plurality of external connection terminals being arranged on a separate one of intersection points of first imaginary lines in rows and second imaginary lines in columns on the surface of the sealing body,
    wherein each external connection terminal is adjacent to an intersection point that is vacant of another external connection terminal in at least one direction of eight directions from each external connection terminal, the eight directions including first linear directions along a row of the rows, second linear directions along a column of the columns perpendicular to the first linear directions, and four diagonal directions defined between the first linear directions and the second linear directions, and each of the first imaginary lines and each of the second imaginary lines includes at least one of the plurality of external connection terminals except for two outer-most lines in the rows and in the columns, which do not include any of the plurality of external connection terminals.

2. A wiring board for receiving a semiconductor package thereon, the semiconductor package having a plurality of external connection terminals arranged in a grid, the wiring board comprising:
    a substrate having a first surface for receiving the semiconductor package thereon;
    a plurality of pads being disposed on the first surface of the substrate to correspond to the external connection terminals to be electrically connected to the external connection terminals; and
    a surface wiring being disposed on the first surface of the substrate, the surface wiring having a first end electrically connected to one of the pads, the surface wiring having a width greater than a predetermined value, wherein
    on the first surface of the substrate, each of the pads are arranged on a separate one of intersection points of first imaginary lines in rows and second imaginary lines in columns such that each pad is adjacent to an area on an intersection point that is vacant of another pad in at least one direction of eight directions from each pad, the eight directions including first linear directions along a row of the rows, second linear directions along a column of the columns perpendicular to the first linear directions, and four diagonal directions defined between the first linear directions and the second linear directions, and each of the first imaginary lines and each of the second imaginary lines includes at least one of the ads except for two outer-most lines in the rows and in the columns which do not include any of the pads.

3. The wiring board according to claim 2, further comprising:
    a via being disposed in the substrate, the via having a first end exposing on the first surface of the substrate and being electrically connected to a second end of the surface wiring, the via extending from the first surface of the substrate toward a second surface of the substrate; and
    a non-surface wiring being disposed in the substrate between the first surface and the second surface, and being electrically connected to a second end of the via.

4. The wiring board according to claim 2, further comprising;
    a via being disposed in the substrate, the via having a first end exposing on the first surface of the substrate and being electrically connected to a second end of the surface wiring, the via extending from the first surface of the substrate to a second surface of the substrate; and a non-surface wiring being disposed on a second surface of the substrate and being electrically connected to a second end of the via.

5. The wiring board according to claim 2, wherein the predetermined value of the width of the surface wiring is a value obtained by subtracting a dimension of clearances to be kept on opposite sides of the surface wiring when the surface wiring is located between adjacent pads from a minimum value of a distance between the adjacent pads.

6. The wiring board according to claim 2, wherein the predetermined value of the width of the surface wiring is a minimum value of a distance between adjacent pads.

7. The wiring board according to claim 2, further comprising:
a power wiring being disposed on the first surface of the substrate and allowing an electric current supplied to an object to be controlled by the semiconductor package to flow.

8. The wiring board according to claim 7, wherein the object to be controlled is a rotary electric machine of an electric power steering apparatus for outputting a steering assist torque.

9. A wiring board for receiving a semiconductor package thereon, the semiconductor package having a plurality of external connection terminals arranged in a grid, the wiring board comprising:
a substrate having a first surface for receiving the semiconductor package thereon;
a plurality of pads being disposed on the first surface of the substrate to correspond to the external connection terminals to be electrically connected to the external connection terminals; and
a surface wiring being disposed on the first surface of the substrate, the surface wiring having a first end electrically connected to one of the pads, the surface wiring having a width greater than a predetermined value, wherein
on the first surface of the substrate, the pads are arranged such that each pad is adjacent to a specific area vacant of another pad in at least one direction of eight directions from each pad, the eight directions including first linear directions along a row of the grid, second linear directions along a row of the grid perpendicular to the first linear directions, and four diagonal directions defined between the first linear directions and the second linear directions, and
the predetermined value of the width of the surface wiring is a value obtained by subtracting a dimension of clearances to be kept on opposite sides of the surface wiring when the surface wiring is located between adjacent pads from a minimum value of a distance between the adjacent pads.

10. A wiring board for receiving a semiconductor package thereon, the semiconductor package having a plurality of external connection terminals arranged in a grid, the wiring board comprising:
a substrate having a first surface for receiving the semiconductor package thereon;
a plurality of pads being disposed on the first surface of the substrate to correspond to the external connection terminals to be electrically connected to the external connection terminals; and
a surface wiring being disposed on the first surface of the substrate, the surface wiring having a first end electrically connected to one of the pads, the surface wiring having a width greater than a predetermined value, wherein
on the first surface of the substrate, the pads are arranged such that each pad is adjacent to a specific area vacant of another pad in at least one direction of eight directions from each pad, the eight directions including first linear directions along a row of the grid, second linear directions along a row of the grid perpendicular to the first linear directions, and four diagonal directions defined between the first linear directions and the second linear directions, and
the predetermined value of the width of the surface wiring is a minimum value of a distance between adjacent pads.

11. A wiring board for receiving a semiconductor package thereon, the semiconductor package having a plurality of external connection terminals arranged in a grid, the wiring board comprising:
a substrate having a first surface for receiving the semiconductor package thereon;
a plurality of pads being disposed on the first surface of the substrate to correspond to the external connection terminals to be electrically connected to the external connection terminals;
a surface wiring being disposed on the first surface of the substrate, the surface wiring having a first end electrically connected to one of the pads, the surface wiring having a width greater than a predetermined value; and
a power wiring being disposed on the first surface of the substrate and allowing an electric current supplied to an object to be controlled by the semiconductor package to flow, wherein
on the first surface of the substrate, the pads are arranged such that each pad is adjacent to a specific area vacant of another pad in at least one direction of eight directions from each pad, the eight directions including first linear directions along a row of the grid, second linear directions along a row of the grid perpendicular to the first linear directions, and four diagonal directions defined between the first linear directions and the second linear directions.

* * * * *